United States Patent [19]

Welch et al.

[11] Patent Number: 4,751,711
[45] Date of Patent: Jun. 14, 1988

[54] ASYMMETRIC OFFSET STRIPE LASER FOR EMISSION IN A SINGLE LOBE

[75] Inventors: David Welch, San Jose; Peter Cross, Palo Alto; Donald R. Scifres, San Jose, all of Calif.

[73] Assignee: Spectra Diode Laboratories, Inc., San Jose, Calif.

[21] Appl. No.: 766,637

[22] Filed: Aug. 16, 1985

[51] Int. Cl.$^4$ ................................................. H01S 3/19
[52] U.S. Cl. ........................................ 372/50; 372/18; 372/46
[58] Field of Search ..................... 372/50, 45, 46, 49, 372/18

[56] References Cited

U.S. PATENT DOCUMENTS

| Re. 31,806 | 1/1985 | Scifres et al. | 372/50 |
|---|---|---|---|
| 4,255,717 | 3/1981 | Scifres et al. | 331/94.5 H |
| 4,641,311 | 2/1987 | Ackley | 372/50 |
| 4,594,719 | 6/1986 | Ackley | 372/50 |
| 4,624,000 | 11/1986 | Streifer et al. | 372/46 |

OTHER PUBLICATIONS

Streifer et al., William, "Phased Array Diode Lasers", Laser Focus/Electro-Optics, Jun. 1984.
Holonyak, Nick Jr., et al., "Quantum-Well Heterostructure Lasers," IEEE Journal of Quantum Electronics, vol. QE-16, No. 2, Feb. 1980, pp. 170-186.
Wolfe, Alexander, "Arrays of Lasers are Bright Spot at CLEO", pp. 30-34, Electronics Week, Jun. 3, 1985.
Welch, et al., "High Power (575 MW) Single Lobed Emission from a Phased Array Laser", submitted to Electronics Letters.

Primary Examiner—James W. Davie
Attorney, Agent, or Firm—Thomas Schneck

[57] ABSTRACT

A phased array laser having a laterally asymmetric variation in the gain or coupling of lasing elements of the array for emission in a single far field lobe. The lasing elements are confined by internal waveguide structuring, periodically spaced current confinement stripes, or by a hybrid of both waveguiding and current confinement. The widths, lengths, depths, or separations of the waveguides or stripes vary laterally across the array to affect the gain or coupling of the lasing elements. Alternate embodiments introduce lateral asymmetry in the active region or other layer thicknesses, doping, mirror facet reflectivities, A1 content of the layers, heat dissipation, or thicknesses of electrical contacts. The laterally asymmetric variations may be linear or nonlinear, monotonically increase from one edge to the other edge, or may be such that the relevant parameter is greatest or least in the center of the array.

30 Claims, 10 Drawing Sheets

ASYMMETRIC OFFSET STRIPE LASER FOR EMISSION IN A SINGLE LOBE

DESCRIPTION

1. Technical Field

The present invention relates to phased array semiconductor lasers and in particular to phased array lasers having structural design that maintains their operation in a preferred single lobe far field pattern.

2. Background Art

Phased array semiconductor lasers comprise an array of closely coupled or spaced emitters on the same integral structure or substrate. Examples of such phased array lasers are illustrated in U.S. Pat. No. 4,255,717 to Scifres et al., and in an article of William Streifer et al., entitled "Phased Array Diode Lasers," published in the June, 1984 issue of Laser Focus/Electro-Optics. The emitters of such a laser are confined by internal waveguide structuring, by periodically spaced current confinement means, e.g. stripes, for current pumping and establishment of spaced optical filaments in the active region of the structure, or by a hybrid of both internal waveguiding and current confinement. The current confinement means may be interconnected or the emitters closely spaced to such a degree that the optical field established in each of the filaments overlaps into and couples to that of adjacent optical filaments, and the array of optical fields produced becomes phase locked.

The operation of phased array lasers is generally interpreted in terms of "supermodes". Individual emitters in the array oscillate collectively in spatial supermodes determined by properties of the entire array. The optical field of each supermode is a superposition of the fields of the phase-locked mode of each emitter, and each supermode is distinguished by its characteristic set of modal amplitudes and phases. The analysis usually presumes that the emitters are identical and that each emitter is identically coupled to its adjacent emitters.

Figure 11A:
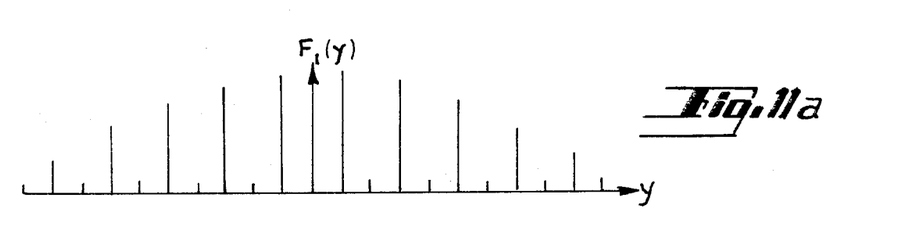
FIGS. 11a-11c illustrate the supermode field amplitude patterns for the fundamental, tenth and second supermodes of an array of ten coupled emitters.
Figure 11B:
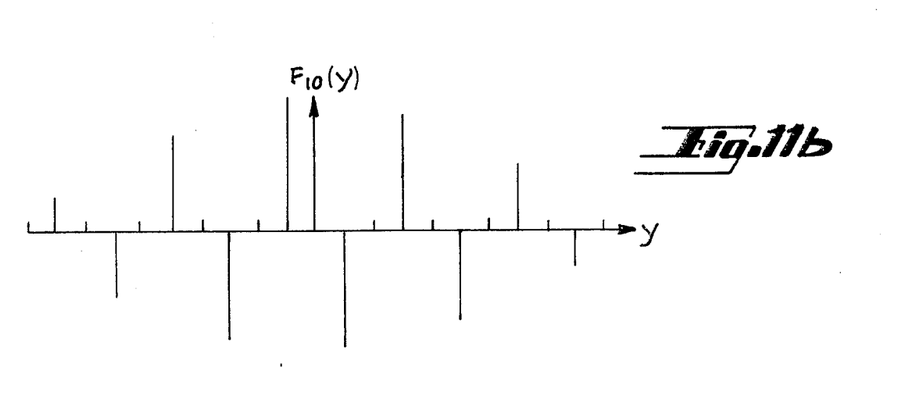
Figure 11C:
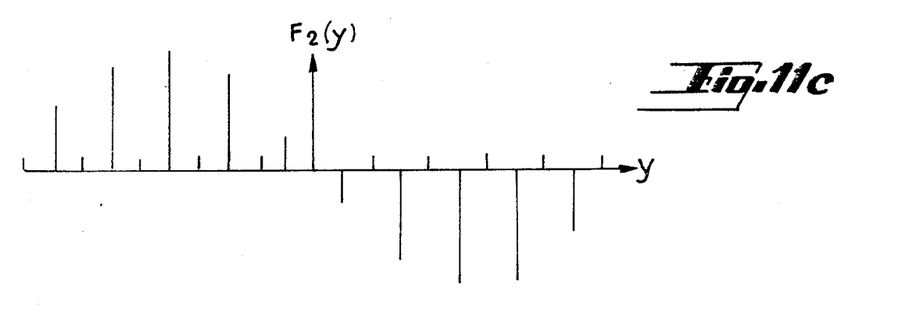

The foregoing explanation is exemplified by reference to FIGS. 11a-11c, which are a schematic illustration of an array of N coupled emitters wherein, in the particular case shown, N=10. For an array of N coupled emitters, there exist exactly N supermodes. Each supermode has the property that the first and the Nth supermode have the same intensity pattern or envelope, the 2nd and the (N−1)th have the same intensity envelope, and, in general, the ith and the (N−i+1)th have the same intensity envelopes.

FIG. 11a shows the first or fundamental supermode field amplitude pattern $F_1(y)$ for a ten emitter or element array laser. The fundamental supermode has all emitters lasing in phase with an amplitude distribution representative of half a sinusoidal cycle.

FIG. 11b shows the supermode field amplitude pattern $F_{10}(y)$ for the Nth supermode which, for this particular example, is the 10th supermode. The amplitude pattern is very similar to the amplitude pattern shown for the fundamental supermode in FIG. 11a, except that adjacent emitters have alternating phase, i.e. are out of phase by 180 degrees.

There are eight other supermodes for an array of 10 coupled emitters. The supermode pattern $F_2(y)$ for the second supermode is shown in FIG. 11c, wherein the amplitude envelope across the array is representative of one complete sinusoidal cycle comprising one positive half cycle and one negative half cycle.

If the phase difference between adjacent emitters is zero, i.e. if all of the emitters radiate in phase, then the lateral far field radiation pattern will comprise a single central lobe. The fundamental supermode is the only supermode having a single lobe far field pattern. The Nth supermode radiates in two fairly symmetrical lobes in the far field pattern. The 2nd supermode radiates in two closely spaced symmetrical lobes in the far field pattern.

Phased array lasers have high utility due to their high power output. It is preferred that the power be concentrated in a single lobe, i.e. in the fundamental supermode. The reason is that a substantial majority of all laser applications require power in a single far field lobe. If radiation is experienced in more than one lobe, measures are taken to diminish or otherwise attempt to eliminate or block off the other operating lobes.

However, as explained in the above mentioned article, it is now well known that phased array semiconductor lasers usually radiate in two lobes in the far field rather than in a single lobe. The relationship between adjacent emitters is not under control, and the phases adjust in a manner to minimize laser threshold current. Usually the first or fundamental supermode and the Nth supermode have the lowest current thresholds as compared to all other supermodes because their intensity envelopes do not exhibit nulls near the center of the array where the charge density is greater as a result of current spreading and charge diffusion in the active region of the array. However, the Nth supermode, which radiates in two lobes, usually has a lower current threshold of operation than the first supermode. This is because in most real refractive index waveguide lasers, as well as many gain guided, lasers, pumping is reduced at locations between laser emitters, so lasing is favored in a supermode wherein the optical field between adjacent emitters passes through zero.

Figure 12A:
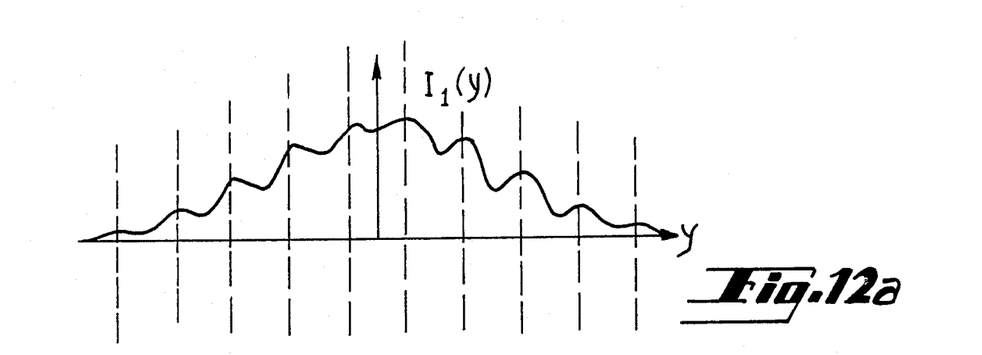
FIGS. 12a-12c illustrate the intensity envelopes of the fundamental and Nth supermodes versus the corresponding gain profile of a prior art laser.
Figure 12B:
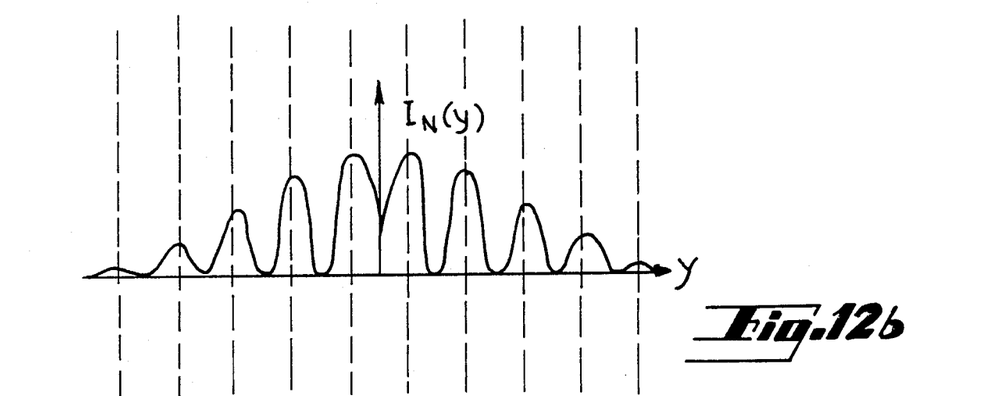
Figure 12C:
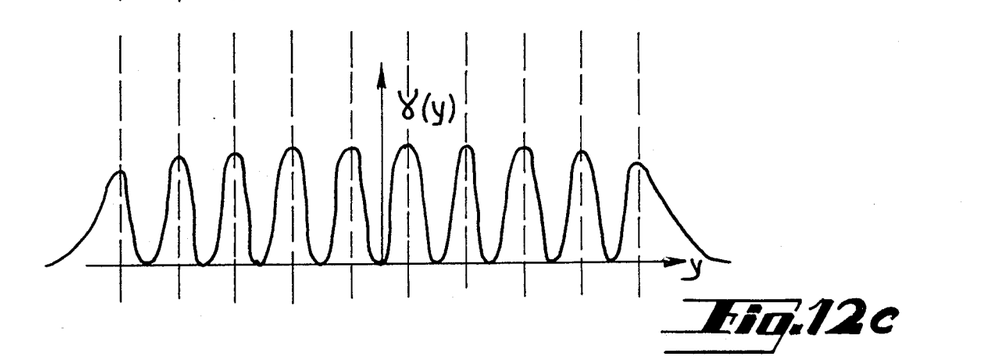
Figure 13A:
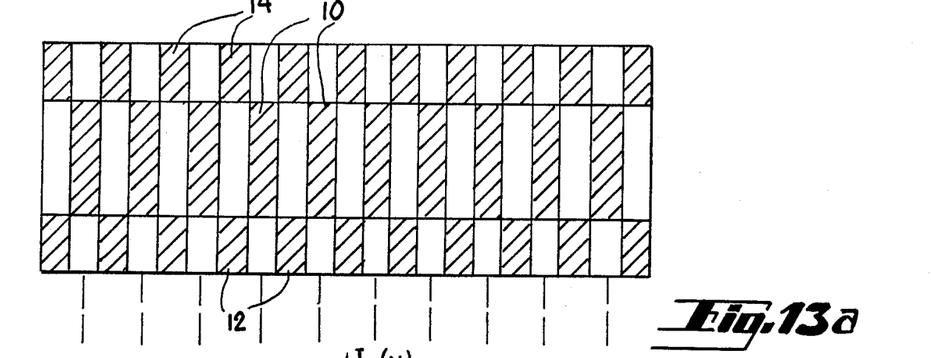
FIG. 13a is a top plan view of a phased array offset stripe laser of the prior art.
Figure 13B:
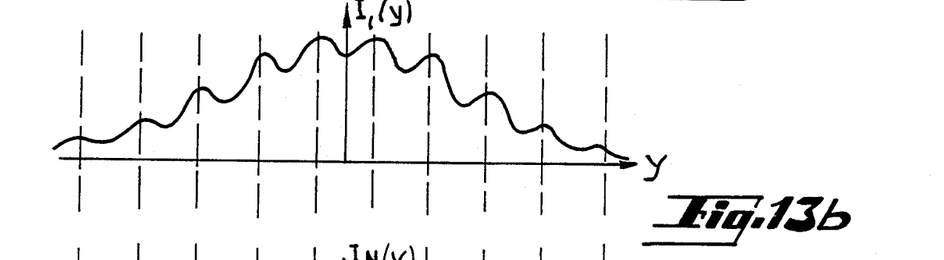
Figure 13C:
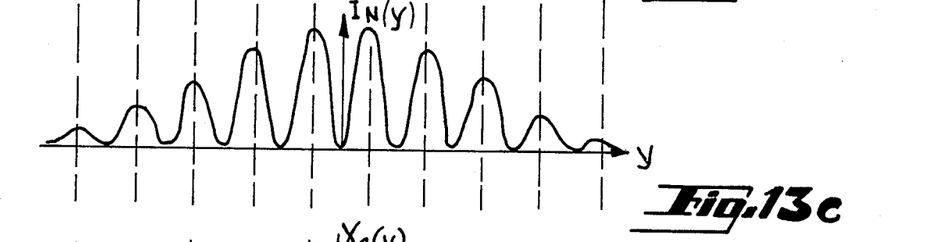
Figure 13D:
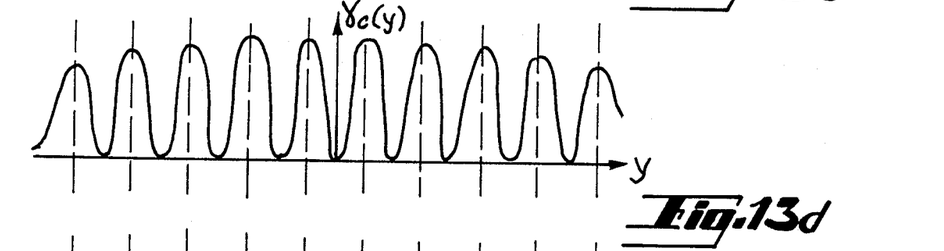
Figure 13E:
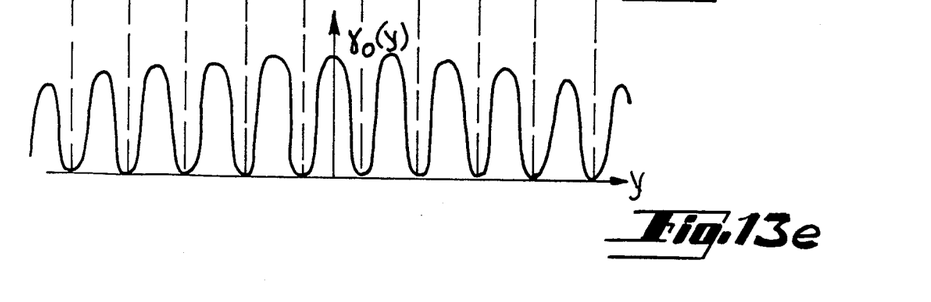

In the case of a multi-emitter laser with a waveguide at each emitter and an adjacent planar active region, the intensity I(y) for the first and Nth supermodes will respectively take on the intensity envelopes illustrated in FIGS. 12a and 12b and the corresponding gain profile $\gamma(Y)$ will have the envelope shown in FIG. 12c. The intensity envelope for the first supermode in FIG. 12a illustrates the lower degree of spatial modulation as compared to the intensity pattern for Nth supermode. To be noted is that the local gain peaks of each of the emitters coincides with the first and Nth mode peaks.

In the case where the emitters of the phased array laser are real refractive index waveguide lasers, the overall gain of the first and Nth supermodes are given by the equations:

$$g_l = \int_{-\infty}^{\infty} I(y)\gamma(y)dy / \int_{-\infty}^{\infty} I(y)dy$$

and $$g_N = \int_{-\infty}^{\infty} I_N(y)\gamma(y)dy / \int_{-\infty}^{\infty} I_N(y)dy$$

Since $I_N$ is relatively more concentrated in the regions of the waveguides where local gain is a maximum, the overall gain of $I_N$ mode exceeds that of $I_1$ mode and the $I_N$ mode, as a result, lases at a lower pumping current. As a result, the Nth supermode will be preferred since it has a lower threshold of operation than the first supermode. Unfortunately, the Nth supermode radiates in two lobes, as previously mentioned.

Recently, there has been much activity relative to phased array lasers where efforts have been established to discriminate among the supermodes and provide fundamental supermode selection. One such suggestion provides an offset stripe structure in phased array lasers that shifts the region of higher gain one-half period relative to the region of preferred optical wave-guidance, i.e., the region of higher equivalent refractive index representative of the optical lasing cavity of each of the emitters of the array laser, so that gain peaks coincide with points of low emission intensity of the supermodes. Then the gain, $g_1$, of the preferred fundamental supermode will exceed the gain, $g_N$, of the multi-lobe Nth supermode of such phased array lasers.

This is graphically illustrated in FIG. 13 $a$–$e$ wherein one type of phased array offset stripe laser is shown. The laser in FIG. 13$a$ has cavity current confinement stripes 10 positioned relative to each optical cavity for directly pumping the cavities and offset current confinement stripes 12 and 14 at regions between the optical cavities for favoring the preferred fundamental supermode. The intensities for the fundamental and Nth supermode respectively take on the intensity envelopes illustrated in FIGS. 13$b$ and 13$c$. The gain profile $\gamma_c(y)$ for that part of the laser having cavity current confinement stripes has the envelope shown in FIG. 13$d$. To be noted is that the local gain peaks of each of the emitters coincides with the fundamental and Nth mode peaks. Since $I_N$ is relatively more concentrated in the regions where local gain is maximum, the Nth mode is favored. The gain profile $\gamma_o(y)$ for those parts of the laser having offset stripes has the envelope shown in FIG. 13$e$. In these parts of the laser, the local gain peaks are shifted one-half period relative to the peaks in the central section so that they coincide with the low points of the supermode intensity pattern. In these parts of the laser, the fundamental mode is favored.

With this type of offset stripe laser, the fundamental supermode and the Nth supermodes are excited. The fundamental and Nth supermodes as well as the other supermodes experience nearly equal overall gain and have nearly the same threshold. Consequently, such a laser can lase simultaneously in all supermodes, resulting in degraded optical characteristics such as a broadened far field pattern.

An object of the present invention is to provide improved phased array offset stripe lasers that operate in the preferred fundamental supermode.

DISCLOSURE OF THE INVENTION

The above object has been achieved with an improved phased array offset stripe laser which breaks the degeneracy of the current thresholds for the fundamental and the higher order supermodes so that a single lobed far field radiation pattern is favored. The phased array laser has an array of spatially displaced multiple lasing elements receiving gain from a nearby active region and bounded within optical cavities for light wave generation and propagation under lasing conditions. Each of the lasing elements or emitters optically couples into adjacent lasing elements to provide a phase locked condition across the array. The laser has a plurality of parallel, spaced apart cavity current confinement stripes positioned relative to each optical cavity for directly pumping the cavities. By stating that the current confinement stripes are positioned "relative" to each optical cavity is meant that the position of a current confinement stripe is in direct geometric or electrical relation to an optical cavity, such as directly above it or in close electrical communication therewith or aligned with output beams. The stripes are discontinuous, interrupted by offset current confinement stripes positioned at regions whose projection lies between optical cavities for increasing the gain in the between regions to favor the fundamental mode. In this application reference to the fact that some current confinement stripes, usually offset stripes, lie "between" optical cavities means that in top view the projected stripe image lies between optical cavities. The number of offsets may be more than one. However, unlike prior offset stripe lasers in which fundamental and higher order supermodes had the same current threshold, the improved offset stripe lasers of the present invention break the degeneracy by introducing a lateral variation in the gain or coupling. Emitters in an array are no longer identical, nor are they identically coupled to adjacent emitters.

The lateral variation in the gain is accomplished in several ways. In one embodiment, the widths of the current confinement stripes vary across the array. Alternatively, the stripe widths may be all identical but the separations between stripes vary across the array, thereby affecting the coupling between adjacent lasing elements. The stripes may be skewed at a small angle to the optical cavity. The stripe lengths, the depths of the insulating implants between stripes, the thickness of the metallization layers, the electrical contact thickness, the active region and other laser medium thicknesses, mirror facet reflectivities, amount of doping, the Al content of the waveguides, and the heat dissipation of the heat sinks may also be varied laterally across the array in order to favor the fundamental supermode of the phased array laser. The variations across the array are typically such that the width or other parameter is greatest at one edge of the array and decreases to a minimum at the other edge of the array. Alternatively, the relevant parameter may be smallest at the center of the array and increase to a maximum at the lateral edges of the array, or may monotonically increase across the array from one lateral edge to the other. The variations need not be linear nor monotonic and may be representative of, for example, a sinusoid or other curve.

The variations introduce a kind of "asymmetry" in that each emitter is no longer identical or coupled identically to adjacent emitters. As a result, the degeneracy in the threshold is broken and the laser does not radiate simultaneously in two or more supermodes. The variations are such as to favor the desired fundamental supermode with its single narrow lobe in the far field.

BRIEF DESCRIPTION OF DRAWINGS

FIG. 1$a$ is a partial side elevation of a laser in accord with the present invention.

FIG. 1$b$ is a partial side elevation of another laser in accord with the present invention.

FIG. 1$c$ is a partial side elevation of a third laser in accord with the present invention.

FIGS. 13b-13e illustrate the intensity envelopes of the fundamental and Nth supermodes versus the gain profiles of the cavity and offset portions of the laser in FIG. 13a.

BEST MODE FOR CARRYING OUT THE INVENTION

Figure 1A:
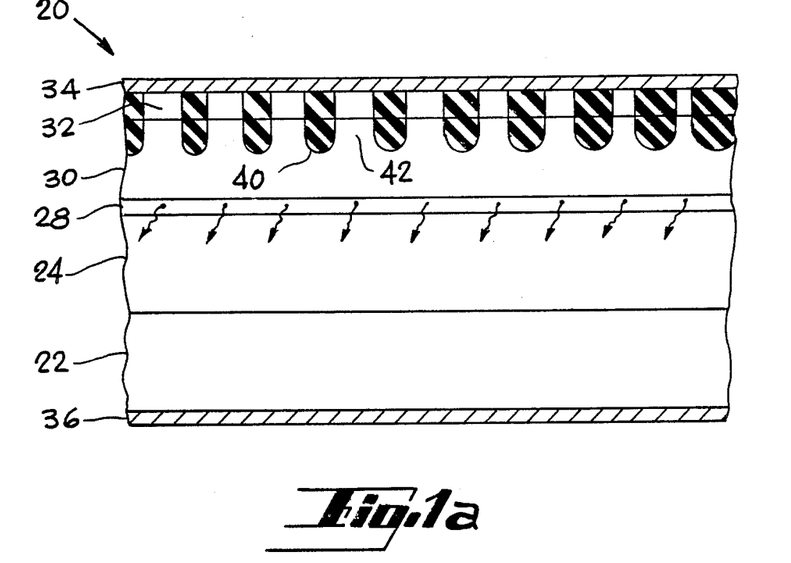

With reference to FIG. 1a, a phased array semiconductor laser 20 is illustrated in the III-V material system of GaAs/GaAAs, as is the case also for subsequent embodiments to be described. Other light emitting materials may be employed, such as InGaAsP, GaAlP, GaAlSb, PbSnTe, SiC, or any other III-V, II-VI or IV-VI semiconductor material or any organic material or compound that will support lasing action.

Laser 20 comprises n-GaAs substrate 22 upon which are consecutively deposited a cladding layer 24 of n-$Ga_{1-z}Al_zAs$, active region 28, cladding layer 30 of p-$Ga_{1-x}Al_xAs$ and contact layer 32 of p+-GaAs. Deposited on contact layer 32 is a continuous broad area metal contact 34. On the bottom surface of substrate 22 is deposited a continuous broad area metal contact 36. Active region 28 may comprise a single active layer or, alternatively, may comprise an active region of either single quantum well or multiquantum well as is known in the art. Quantum well and multiquantum well lasers are described in the article by Nick Holonyak Jr, et al., "Quantum-Well Heterostructure Lasers," IEEE Journal of Quantum Electronics, vol. QE-16, No. 2, Feb. 1980. Laser 20 is generally a gain guided laser, although any of the layers 24 and 30 may have a lateral spatial modulation in their refractive index to produce an array of index guided multiple lasing elements. By "spatial modulation" is meant a generally periodic variation in a parameter such as thickness change 38 in FIG. 1b, laterally across the array with no such variation in a longitudinal direction along individual lasing elements.

Phased array laser 20 also includes means to provide current distribution for channeling pumping current in the contact layer preferentially to offset regions where higher gain is desired. This means comprises implant regions 40 which may, for example, be insulating H+ implanted regions, alternating insulating regions on the surface of layer 32 or other means of selective current flow. As a result, pumping current provided via contact 34 is channeled through current confinement stripes 42 between insulating regions 40.

Figure 1B:
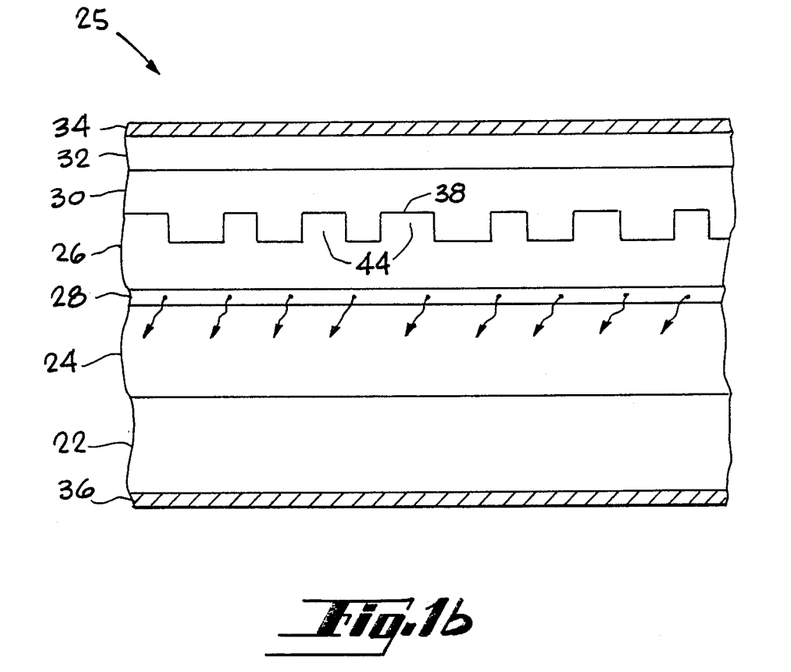

Another phased array laser 25, in FIG. 1b, is an index guided array laser comprising an n-GaAs substrate 22 upon which are consecutively deposited a cladding layer 24 of n-$Ga_{1-z}Al_zAs$, active region 28, a transparent light confining waveguide layer 26 of p-$Ga_{1-y}Al_yAs$, cladding layer 30 of p-$Ga_{1-x}Al_xAs$ and contact layer 32 of p+-GaAs. Layers 24, 26, and 30 create an optical waveguide in active region 28. Continuous broad area metal contacts 34 and 36 are deposited on layer 32 and substrate 22 respectively. A spatially modulated thickness change in layer 26, referred to as modulation 38, in combination with different indices of refraction for layers 26 and 30 produces a lateral spatial modulation, i.e. periodic variation, in the refractive index for guiding lightwave propagation in optical guide regions 44. Typically, a difference in index of refraction of 0.01 is sufficient for light wave guiding.

Figure 1C:
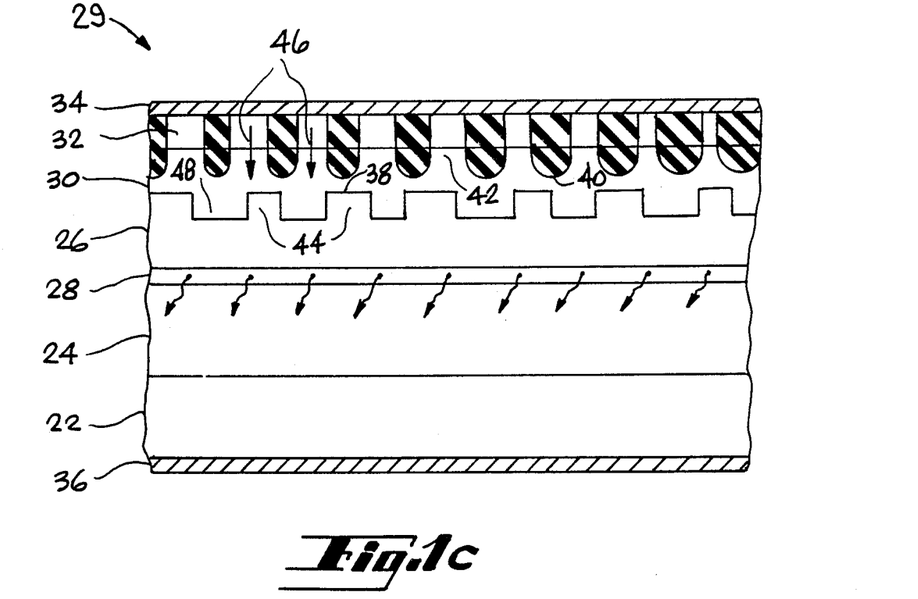

A laser 29 in FIG. 1c has both the implant regions 40 of laser 20 and the light confining waveguide layer 26 of laser 25. Pumping current provided via contact 34 is channeled through current confinement stripes 42 between insulating regions 40 in a direction toward regions 48 between waveguide regions 44, which current channeling is depicted by arrows 46. The waveguide regions 44 need not be aligned with stripes 42.

The phased array lasers 20, 25 and 29 in FIGS. 1a-c may be grown by conventional epitaxy. The structures shown in FIGS. 1a-c are most easily grown in a liquid phase epitaxy (LPE) and can also be accomplished utilizing masking techniques in molecular beam (MBE) epitaxy or metal-organic chemical vapor deposition (MO-CVD) The procedure for growth of lasers 25 and 29 requires that layers 24, 28 and 26 be initially grown. The structure is then removed from the growth environment for selectively etching the surface of layer 26 with standard photolithographic procedures to provide a periodic corrugation structure or modulation 38. This corrugation creates light guiding regions 44. The modulation 38 occurs laterally across the array as a square-wave-like variation in the thickness of layer 26. Typically, this thickness variation ranges from 500 to 5000 Angstroms with a period of between two and four microns. Similarly substrate 22 may be selectively etched as layer 26 is or left planar. The structure is then returned to the growth environment for the completion of the growth of layers 30 and 32. Growth of a layer 30 on etched layer 26 having a different composition than layer 26 produces a corresponding spatial modulation in the refractive index laterally across the array. Cleaved ends form mirrors defining optical cavities to provide optical feedback and sustain laser operation.

The widths of the implant regions 40 vary laterally across the array, monotonically increasing from left to right in FIGS. 1a and 1c. Consequently, the width dimension of offset current confinement stripes 42 increases monotonically from right to left. This allows more current to be channelled through stripes 42 on the left end of the laser 20 than on the right end. The widths of waveguide regions 44 in FIGS. 1b and 1c may also vary laterally across the array. Typically, the width, overall, may vary by 20 to 50 percent. The implant width variation is better seen in FIG. 2 wherein implants 40 and offset stripes 42 extend along an offset portion of offset stripe laser 20. Implants 50 and cavity current confinement stripes 52 are disposed relative to optical cavities 44 for direct pumping of the optical cavities and extend along a cavity portion of laser 20. A second set of implants 54 and offset stripes 56 are disposed relative to between regions 48. Current confinement stripes 42, 52 and 56 vary in width across the array in a monotonically increasing manner. Typically, stripes 42, 52 and 56 are separated by about ten microns from center to center with the thicknesses increasing from about four microns to six microns from right to left over ten stripes. The variations need not be linear and other dimensions may also be used. The depths of implants 40 need not be constant across the array, but may also increase from one edge to the other or be thinnest or thickest at the center of the array.

Figure 2:
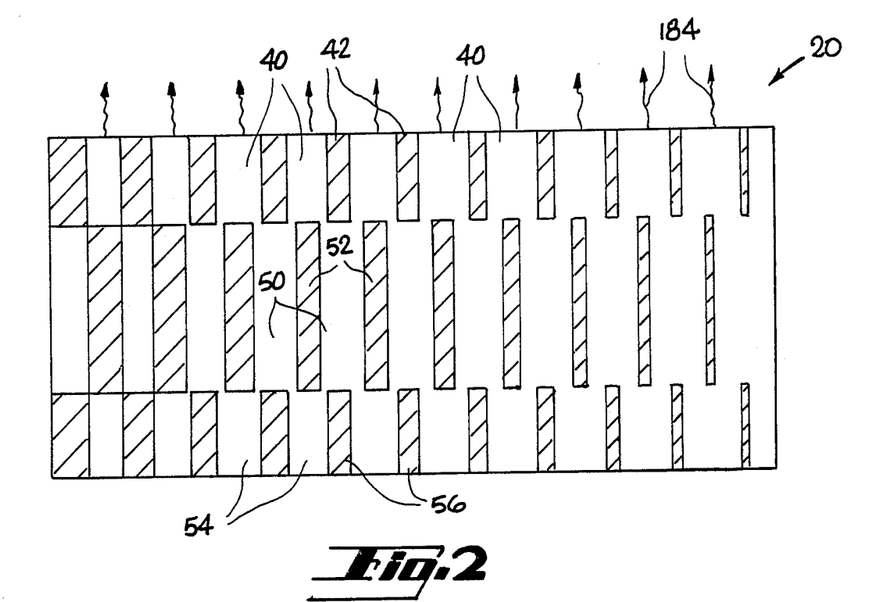
FIG. 2 is a top plan view of the lasers of FIGS. 1$a$ and 1$c$.
Figure 3:
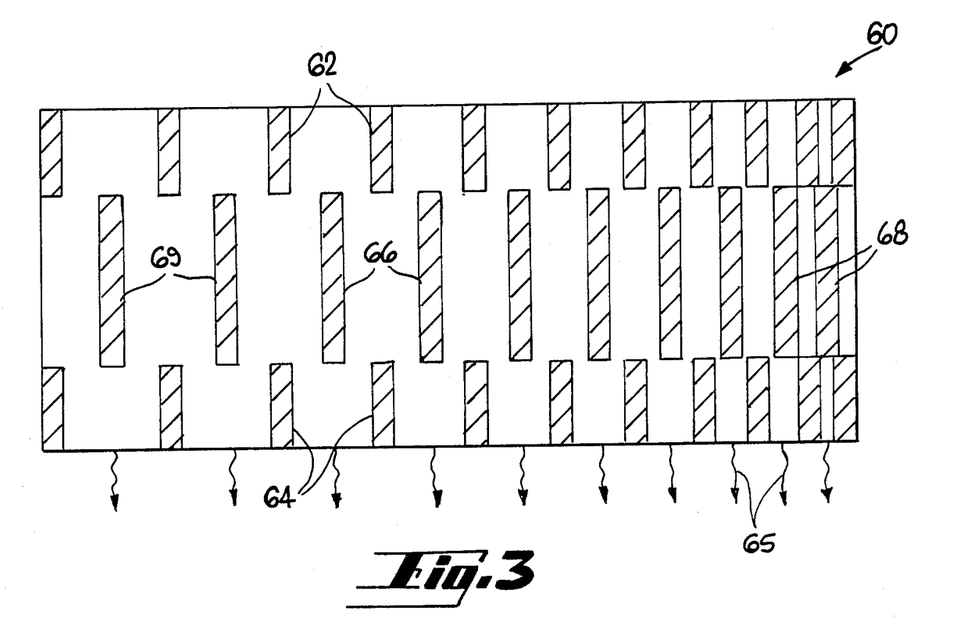
FIG. 3 is a top plan view of a fourth embodiment of the present invention.

The offset stripe laser 60 in FIG. 3 is like laser 20 in FIGS. 1 and 2 except that the separations between offset stripes 62 and 64 and between cavity stripes 66 varies across the array in a monotonically increasing manner. Stripes 68 at one end of laser 60 are packed close together while stripes 69 at the opposite end of laser 60 are spaced further apart. Laser emitters represented by emitted light beams 65 are more heavily pumped on the end with the closely packed stripes 68 than on the end with the further spaced stripes 69. The widths of stripes 62, 64 and 66 are usually constant across the array, but may also vary laterally across the array. Note that there are offset stripe regions 62, 64 on opposite sides of the cavity alignment stripe region 66. Output emitted light beams 64 indicate a positional alignment relation relative to the alignment of cavity stripes. This figure illustrates a plurality of offset regions with respect to cavity stripes.

Figure 4:
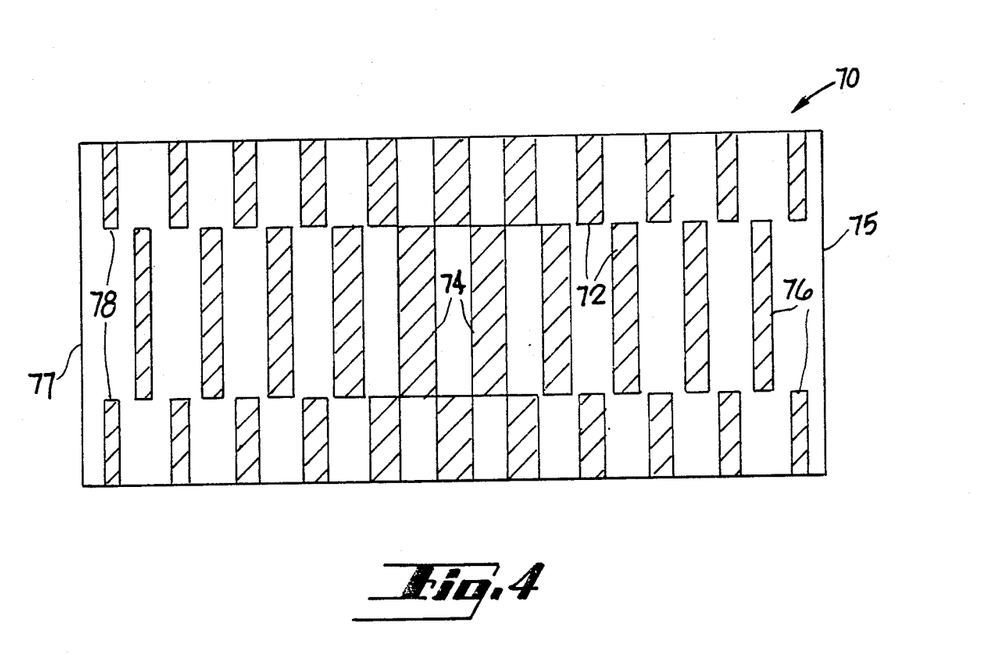
FIG. 4 is a top plan view of a fifth embodiment of the present invention.

A laser 70 in FIG. 4 is like laser 20 in FIGS. 1 and 2 except that the width of stripes 72 vary so that wide stripes 74 are at the center of the array. The stripe widths decrease laterally toward the edges 75 and 77 so that the narrowest stripes 76 and 78 are at each lateral edge 75 and 77. Alternatively, the stripes 72 may be narrowest at the center of the array and increase laterally toward the edges so that the widest stripes are at each lateral edge. In either case, the array is no longer made up of identical emitters, the center emitters being pumped differently and having a different gain than the edge emitters, so the degeneracy is broken. FIG. 4 shows an even number of stripes with two equally wide stripes 74 in the center. Alternatively, an odd number of stripes with the widest or narrowest stripe in the center may be used.

Figure 5:
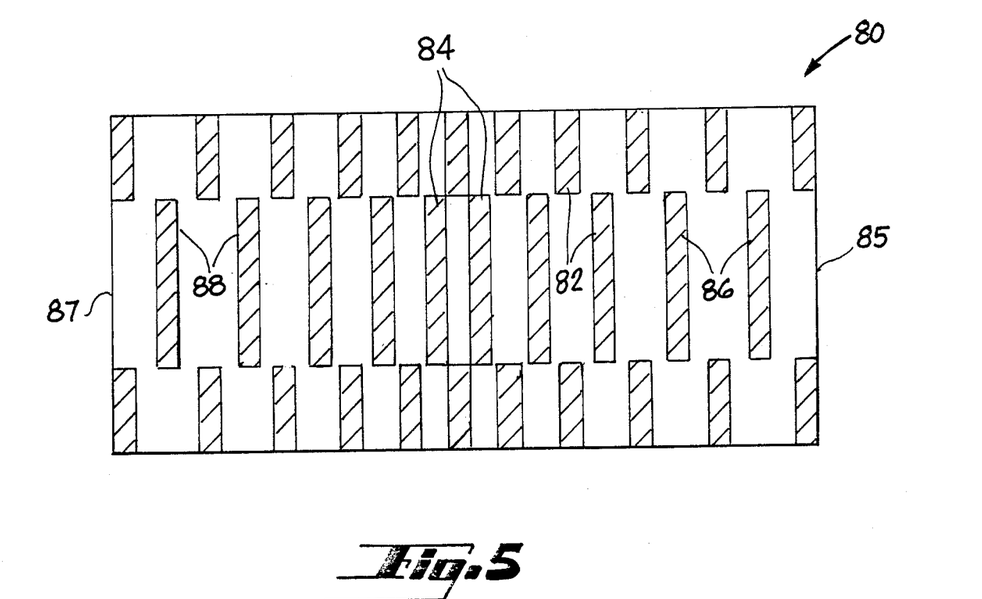
FIG. 5 is a top plan view of a sixth embodiment of the present invention.

A laser 80 in FIG. 5 is like the other lasers discussed above except that the separations of stripes 82 vary so that stripes 84 are close packed at the center of the array. The stripe separations increase laterally toward the edges 85 and 87 so that stripes 86 and 88 are spaced farther apart at the lateral edges 85 and 87. Alternatively, the stripes 82 may be closely packed at the edges 85 and 87 of the array and become spaced further apart at the center of the array. As in FIGS. 4, 5 shows an even number of stripes 82. Alternatively, an odd number of stripes may be used.

Figure 6:
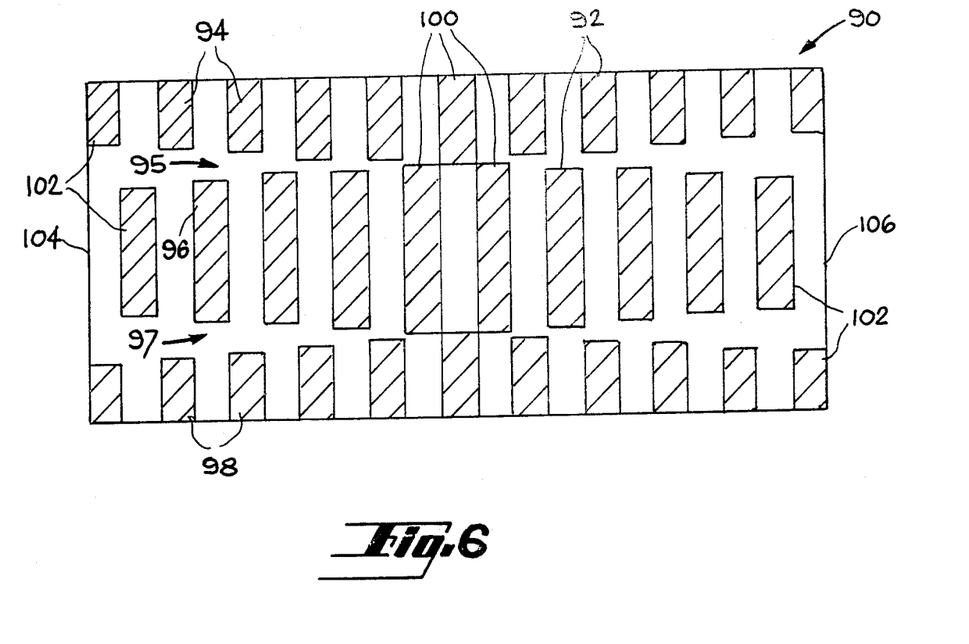
FIG. 6 is a top plan view of a seventh embodiment of the present invention.

In FIG. 6, a laser 90 is like laser 20 in FIGS. 1 and 2 except that current confinement stripes 92 are equal in width and separation but of differing lengths. Laser 90 has offset current confinement stripes 94 and 98 for increasing the gain in the regions between optical cavities to favor the fundamental supermode and cavity current confinement stripes 96 for direct pumping of the optical cavities. The lengths of stripes 92 vary so that the longest stripes 100 are at the center of the array and the lengths decrease toward edges 104 and 106. The shortest stripes 102 are at the lateral edges 104 and 106 of the laser 90. As the stripes 92 shorten, gaps 95 and 97 along the optical cavity increase in length. These gaps 95 and 97 are unpumped absorbing regions between directly pumped portions under cavity stripes 96 and indirectly pumped portions under offset stripes 94 and 98. Accordingly, the emitters in the center of laser 90 have the highest gain and emitters near edges 104 and 106 have the lowest gain. Alternatively, stripes 92 may be longest at the edges 104 and 106 of laser 90 and shortest in the center, or stripe lengths may increase monotonically from one edge to the other.

Figure 7:
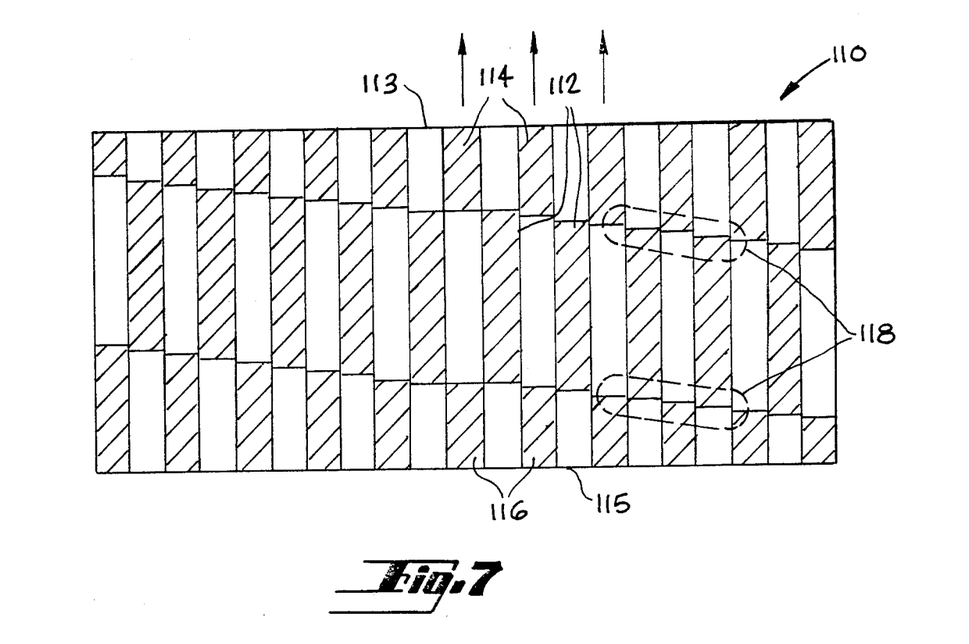
FIG. 7 is a top plan view of an eighth embodiment of the present invention.

In FIG. 7, a laser 110 is like laser 20 in FIGS. 1 and 2 except that stripe widths and separations are equal across the array and cavity stripes 112 are progressively displaced relative to the front and back mirror facets 113 and 115. Offset stripes 114 increase monotonically in length across the array from left to right while offset stripes 116 increase monotonically in length across the array from right to left. The displacements affect the coupling between adjacent emitters at the boundary regions 118 between offset stripes 114 and 116 and cavity stripes 112 so as to break the degeneracy and favor the preferred fundamental mode. Alternatively, offset stripes 114 may increase in length from right to left and offset stripes 116 may increase in length from left to right.

Figure 8:
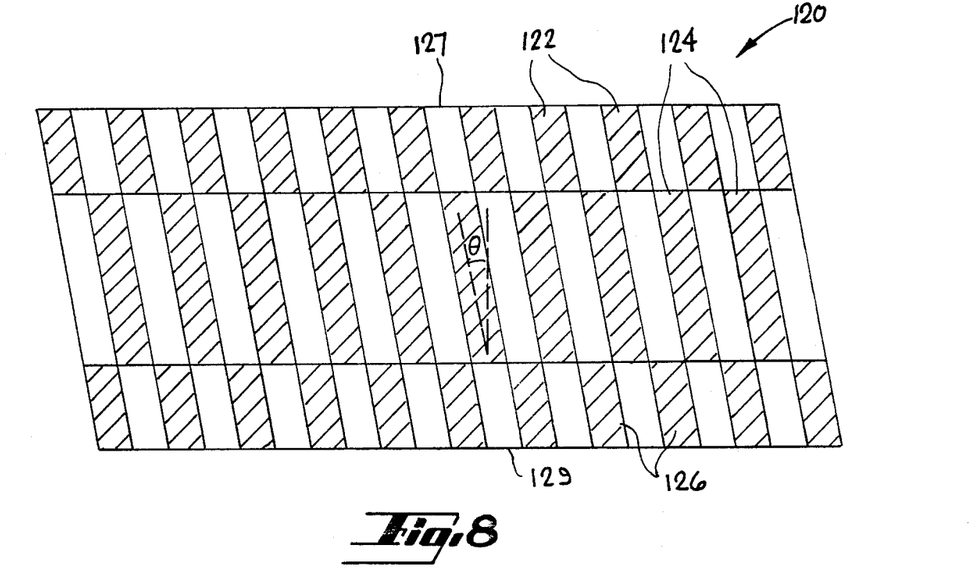
FIG. 8 is a top plan view of a ninth embodiment of the present invention.

Laser 120 in FIG. 8 is like laser 110 in FIG. 10 in that stripe widths and separations are equal across the array. However, instead of progressively displacing cavity stripes, cavity stripes 124 and offset stripes 122 and 126 are skewed relative to mirror facets 127 and 129. The angle of skew $\theta$ which stripes 122, 124, and 126 make with the normal to facets 127 and 129 is generally less than ten degrees. The effect is to create an asymmetry in the laser so that the lowest threshold is the single lobe radiating, fundamental supermode. The lobe will radiate at an angle to the facet, but the laser 120 is rotated so that the output is in whatever direction is desired.

Figure 9:
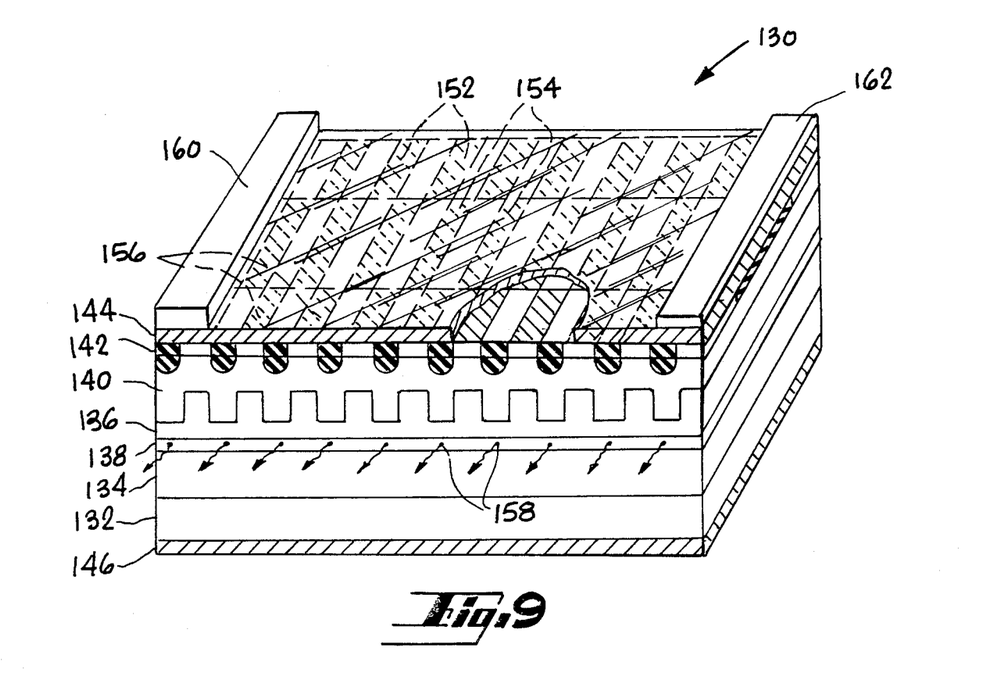
FIG. 9 is a perspective view of a tenth embodiment of the present invention.

In FIG. 9, an offset stripe laser 130 has a substrate 132 upon which are consecutively deposited a cladding layer 134, an active region 138, a waveguide layer 136, a cladding layer 140 and a contact layer 142. Deposited on contact layer 142 is a continuous broad area metallization layer. On the bottom surface of substrate 132 is deposited a continuous broad area metal contact 144. The construction of laser 130 is like that of laser 20 in FIGS. 1c and 2. The top surface of waveguide layer 136 has a periodic structure or undulation 148 which define optical waveguide regions 149. Insulative implants 150 in contact layer 142 create current channeling regions 151 or stripes. Stripes 152 and 156 are offset to favor the fundamental mode, while cavity stripes 154 are disposed relative to the optical cavities, represented by emitted laser light 158, for direct pumping of the optical cavitites. Stripes 152, 154 and 156 are generally constant in length, width and separation across the laser. A degenerate condition in the threshold current between the fundamental and Nth supermodes is broken by resistive contacts 160 and 162, disposed at the lateral edges of laser 130. One contact 160 is substantially thicker than the other contact 162, or the contacts are made of materials having different resistances. In either case, more current flows on one side of the laser than the other, breaking the degeneracy. The current may also be electrically modulated in order to spatially redirect the radiation emitted from the laser.

Figure 10A:
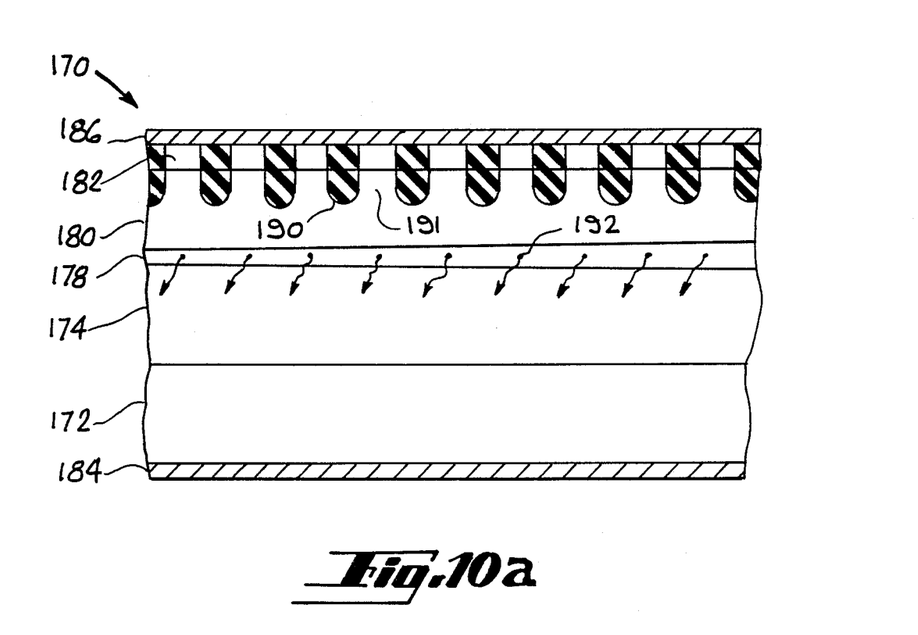
FIG. 10a is a side elevation of an eleventh embodiment of the present invention.
Figure 10B:
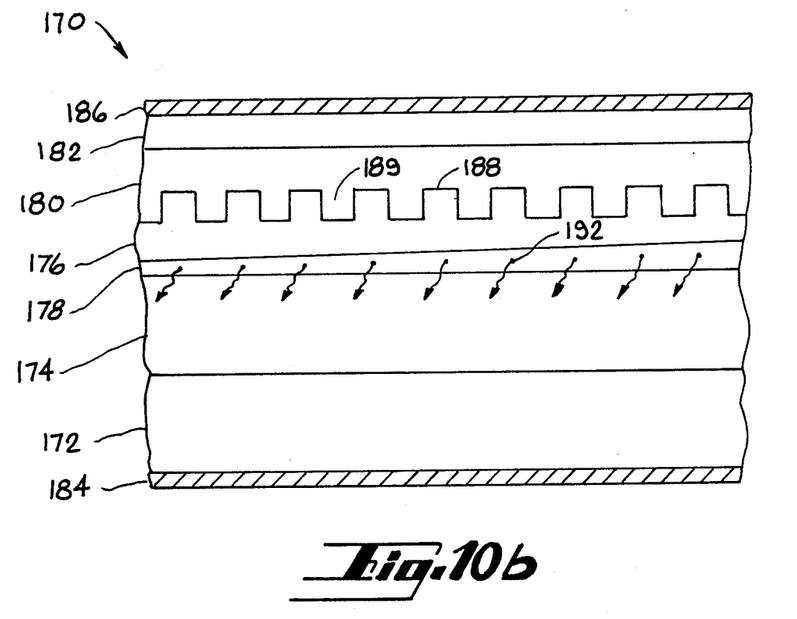
FIG. 10b is a side elevation of a twelfth embodiment of the present invention.
Figure 10C:
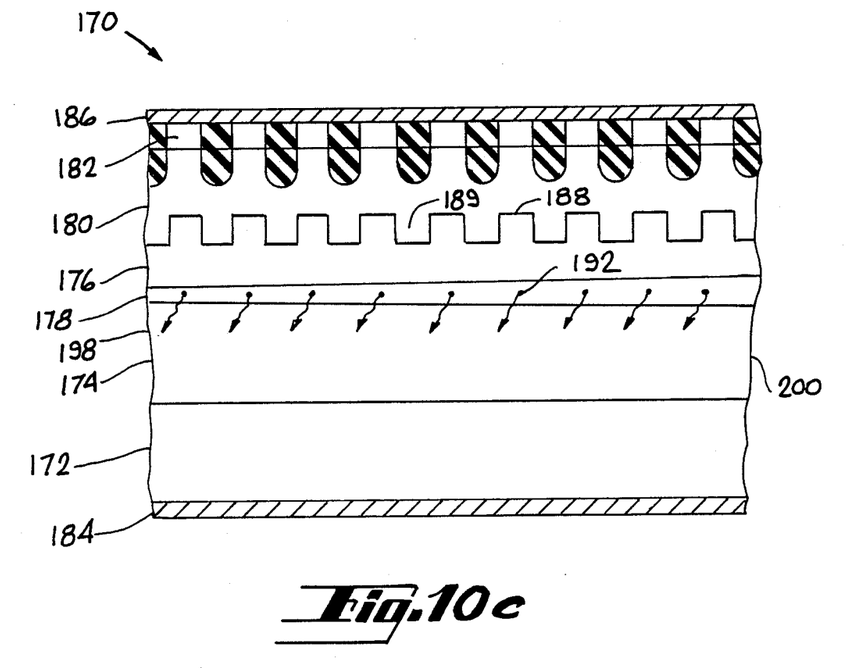
FIG. 10c is a side elevation of a thirteenth embodiment of the present invention.

A laser 170 in FIG. 10a has a substrate 172 upon which are consecutively deposited a cladding layer 174, an active region 178, a cladding layer 180 and a contact layer 182. A metallization layer 186 is deposited on contact layer 182, and a metallization layer 184 is deposited on the underside of substrate 172. Insulative implants 190 in contact layer 182 form current channels 191 for laser pumping. The construction of laser 170 is like that of laser 20 in FIGS. 1a and 2. In FIGS. 10b and 10c a spatial modulation or periodic structure 188 on the top surface of a waveguide layer 176 may be used for waveguide regions 189. Periodic structure 188 is produced the same way as the structure 38 in FIGS. 1b and 1c. Alternatively, a periodic waveguide structure may be formed on the bottom surface of cladding layer 174 or in active region 178.

Laser 170 has an active layer 178 whose thickness varies laterally across the laser. Each emitter 192 therefore experiences a different gain than adjacent emitters. Active region 178 is thinnest at edge 198 and monotonically increases to a maximum thickness at edge 200. Alternatively, active region 178 may be thickest in the center of array laser 170 and decrease laterally toward edges 198 and 200, or may be thinnest in the center of laser 170 and increase toward edges 198 and 200. One or more other layers 172, 174, 176, 180 may also vary in thickness.

The variation in thickness of active region 78, waveguide layer 196 or other layers in FIGS. 10a–c also alters the overlap of the lasing elements with the active region. Each lasing element comprises an optical wave having a central region of peak intensity and tail regions of lower intensity, the wave generally being characterized by a Gaussian function. When the peak intensity region overlaps with the active region 178, such as when the waveguide layer 176 is close to the active region 178, greater gain results. When the waveguide layer 176 is farther from the active region 178, only the lower intensity tail region overlaps the active region, i.e. there is less overlap, and lower gain results. Thus a lateral variation in the overlap of the lasing elements across the array causes a lateral variation in the gain across the array.

Other lateral variations or "asymmetries" will also cause adjacent emitters to no longer be identical or coupled identically so that the fundamental supermode is favored. For example, heating affects a laser gain and waveguiding properties, so laterally varying efficiencies in a laser's heat sinks will also cause the fundamental mode to be favored. Mirror facets such as mirrors 113, 115, 127 and 129 in FIGS. 7 and 8, are generally coated with layers of dielectric material in order to produce specific designed reflectivities. These mirror reflectivities may vary laterally across the array, thereby altering the gains experienced by different optical cavities. Alternatively, the amount of doping in one or more of the layers, such as layers 22, 24, 26, 28, 30 and 32 in FIG. 1, may vary laterally across the array, thereby affecting the gain in the desired fashion. The aluminum content in one or more of the layers, in particular waveguide layers, such as layer 26 in FIG. 1 may vary laterally to affect the degree of coupling between adjacent emitters.

The asymmetries mentioned herein will usually affect the propagation constant, as well as gain. By "propagation constant" is meant a proportionality factor affecting the light velocity characteristic of the optical cavity. It may be possible to maintain either gain or propagation constant at a uniform level, while still achieving the single far field lobe benefit described herein. Accordingly, at least one of the propagation constant and gain is varied by the asymmetries described herein.

Offset stripe lasers may use simultaneously more than one of the asymmetric schemes discussed with reference to FIGS. 1–10. For example, progressively displaced stripes may increase in width laterally from one edge to the other. These asymmetric offset stripe lasers have high utility due to their high power output which is concentrated in a single narrow far field lobe.

We claim:

1. A phased array semiconductor laser comprising, semiconductor diode means for producing an array of lasing elements, said semiconductor diode means having an active region and contact means for delivering current to said active region, said lasing elements receiving gain from said active region and bounded within optical cavities for light wave generation and propagation under lasing conditions, said lasing elements being coupled into adjacent lasing elements to provide a phase locked condition across the array,
   wherein said contact means has resistances for delivering more current to some lasing elements than other lasing elements, the gain experienced by said lasing elements thereby varying laterally across the array.

2. A phased array semiconductor laser comprising, semiconductor diode means for producing an array of lasing elements, the lasing elements receiving gain within optical cavities from an active region of the semiconductor diode means, said lasing elements being coupled into adjacent lasing elements to provide a phase locked condition across the array,
   wherein said semiconductor diode means has current confining stripe means which are discontinuous, each stripe having three segments laterally offset from eaach other, the segments exhibiting an asymmetry in dimensions or position with respect to segments of other stripes for varying laterally across the array the optical coupling experienced by adjacent lasing elements of the array.

3. In a phased array semiconductor laser of the type having an array of spatially disposed multiple lasing elements receiving gain from an active region, said lasing elements bounded within optical cavities for light wave generation and propagation under lasing conditions and wherein said lasing elements are optically coupled into adjacent lasing elements to provide a phase locked condition across the array, the improvement in combination therewith comprising,
   a pattern of spaced apart, parallel, current confining stripes for distributing current in said laser array, a first group of parallel, spaced apart stripes being positioned relative to said optical cavities, a second group of parallel, spaced apart stripes being positioned a-t regions between said optical cavities, the pattern varying laterally across the array.

4. The array laser of claim 3 wherein each of said current confining stripes has a width, a length and a depth, the widths of a number of said stripes increasing laterally across the array.

5. The array laser of claim 4 wherein said stripes lie between insulative implant regions, the depth of insulating implant regions-between adjacent stripes varying across the laser array.

6. The array laser of claim 3 wherein the separation of adjacent lasing elements increases across the array.

7. The array laser of claim 3 wherein the separation of adjacent lasing elements is greatest between lasing elements in the center of the array and decreases laterally toward edge lasing elements of the array.

8. The array laser of claim 3 wherein the separation of adjacent lasing elements is least between lasing elements in the center of the array and increases laterally toward edge lasing elements of the array.

9. The array laser of claim 3 wherein said second group of stripes is offset from the first group of stripes in a manner such that the first group of stripes is discontinuous, being interrupted by the offset second group of stripes.

10. The array laser of claim 9 wherein said first group of stripes is interrupted by more than one second group of stripes.

11. The array laser of claim 4 wherein the width of said stripes is greatest in the center of the array and decreases laterally toward the edges of said array.

12. The array laser of claim 4 wherein the width of said stripes is least in the center of the array and increases laterally toward the edges of said array.

13. The array laser of claim 4 wherein the length of said stripes varies laterally across the array.

14. In a phased array semiconductor laser of the type having an array of spatially disposed multiple lasing elements receiving gain from an active region, said lasing elements bounded within an optical cavity for light wave generation and propagation under lasing conditions, the optical cavity having a characteristic light velocity propagation constant, and wherein lasing elements are optically coupled into adjacent lasing elements to provide a phase locked condition across the array, a first plurality of parallel, spaced apart, cavity current confinement stripes positioned relative to said optical cavity extending along at least one portion of the length of said optical cavity and a second plurality of parallel, spaced apart, current confinement stripes, offset in alignment relative to the first plurality of stripes, and positioned at regions within said optical cavity and extending along at least a second portion of the length of said optical cavity, each stripe having length, width and depth dimensions, the improvement in combination therewith comprising, said offset stripes and said cavity stripes varying in at least one of said dimensions laterally across the array, each lasing element having a different gain relative to adjacent lasing elements.

15. The phased array semiconductor laser of claim 14 wherein the widths of said cavity current confinement stripes and of said offset current confinement stripes vary laterally across the array so as to favor single lobed emission.

16. The phased array semiconductor laser of claim 15 wherein said widths increase monotonically across the array.

17. The phased array semiconductor laser of claim 15 wherein said widths are smallest at lateral edges of the array and increase toward the center of the array.

18. The phased array semiconductor laser of claim 15 wherein said widths are smallest at the center of the array and increase toward lateral edges of the array.

19. The phased array semiconductor laser of claim 14 wherein spacings between adjacent cavity current confinement stripes and between adjacent offset current confinement stripes vary laterally across the array so as to favor the fundamental supermode over the other potential supermodes of said laser.

20. The phased array semiconductor laser of claim 19 wherein said spacings increase monotonically across the array.

21. The phased array semiconductor laser of claim 19 wherein said spacings are smallest at lateral edges of the array and increase toward the center of the array.

22. The phased array semiconductor laser of claim 19 wherein said spacings are smallest at the center of the array and increase toward lateral edges of the array.

23. The phased array semiconductor laser of claim 14 wherein the lengths of said cavity current confinement stripes and of said offset current confinement stripes vary laterally across the array so as to favor the fundamental supermode over the other potential supermodes of said laser.

24. The phased array semiconductor laser of claim 14 wherein said active region has a thickness which varies laterally across the array so as to favor the fundamental supermode over the other potential supermodes of said laser.

25. The phased array semiconductor laser of claim 14 wherein said optical cavities are bounded by coated cleaved end mirrors, the mirrors having a reflectivity which varies laterally so as to favor the fundamental supermode over the other potential supermodes of said laser.

26. The phased array semiconductor laser of claim 14 wherein said optical cavities have light guiding properties which vary laterally across the array so as to favor the fundamental supermode over the other potential supermodes of said laser.

27. The phased array semicnductor laser of claim 14 further comprising heat removal means for removing waste heat from said array, wherein said heat removal means has an efficiency which varies laterally across the array so as to favor the fundamental supermode over the other potential supermodes of said laser.

28. The phased array semiconductor laser of claim 14 wherein said offset stripes and said cavity stripes are askew, said stripes being aligned at an angle of not more than ten degrees relative to said optical cavities.

29. The phased semiconductor array laser of claim 14 wherein the offset stripes on one side of said cavity stripes increase laterally in length from a first lateral edge to a second lateral edge, the offset stripes on the opposite side of said cavity stripes increase laterally in length from the second edge to the first edge, and the cavity stripes are offset along the length of said optical cavities relative to adjacent cavity stripes.

30. The laser of claim 28 wherein said current is modulated electrically in order to cause the radiation emitted from said laser to be spatially redirected.

* * * * *

UNITED STATES PATENT AND TRADEMARK OFFICE
CERTIFICATE OF CORRECTION

PATENT NO. : 4,751,711
DATED : June 14, 1988
INVENTOR(S) : David Welch et al.

It is certified that error appears in the above—identified patent and that said Letters Patent is hereby corrected as shown below:

Column 2, line 34, "many gain guided, lasers," should read
- -many gain guided lasers,- -.

Column 3, line 34, "offset stripes" should read - -offset current confinement stripes- -.

Column 5, line 34, "GaAs/GaAAs," should read - -GaAs/GaAlAs,- -.

Column 7, line 57, "As in Figs. 4, 5 shows" should read
- -As in Fig. 4, Fig. 5 shows- -.

Column 9, line 28, "active region 78" should read - -active region 178- -.

Claim 2, column 10, line 38, "from eaach other" should read
- -from each other- -.

Claim 3, column 10, lines 56-57, "positioned a-t regions" should read - -positioned at regions- -.

Claim 5, column 10, line 65, "implant regions-between adjacent stripes" should read - -implant regions between adjacent stripes- -.

Claim 27, column 12, line 41, "The phased array semicnductor laser" should read - -The phased array semiconductor laser- -.

Signed and Sealed this

Seventh Day of March, 1989

Attest:

DONALD J. QUIGG

Attesting Officer

Commissioner of Patents and Trademarks